(12) United States Patent
Kossel et al.

(10) Patent No.: US 11,271,550 B1
(45) Date of Patent: Mar. 8, 2022

(54) SYNCHRONOUS DIVIDER BASED ON CASCADED RETIMING

(71) Applicant: INTERNATIONAL BUSINESS MACHINES CORPORATION, Armonk, NY (US)

(72) Inventors: Marcel A. Kossel, Reichenburg (CH); Pier Andrea Francese, Adliswil (CH); Mridula Prathapan, Adliswil (CH); Abdullah Serdar Yonar, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/302,185

(22) Filed: Apr. 27, 2021

(51) Int. Cl.
H03K 3/037 (2006.01)
H03L 7/08 (2006.01)
G06F 1/32 (2019.01)

(52) U.S. Cl.
CPC ............... *H03K 3/037* (2013.01); *H03L 7/08* (2013.01); *G06F 1/32* (2013.01)

(58) Field of Classification Search
None
See application file for complete search history.

(56) References Cited

U.S. PATENT DOCUMENTS 6,445,760 B1 * 9/2002 Weintraub ........... H03K 23/588
377/118
6,961,402 B1 11/2005 Younis
9,503,115 B1 * 11/2016 Shin .................... H03M 1/1215
2016/0164533 A1 * 6/2016 Zhai ..................... H03K 23/665
327/115

OTHER PUBLICATIONS

Alfke et al., "Ultra-Fast Synchronous Counters", XILINX, Nov. 24, 1997, 5 pages.
Baert et al., "A 5-GS/s 7.2-ENOB Time-Interleaved VCO-Based ADC Achieving 30.5 fJ/cs", IEEE Journal of Solid-State Circuits, vol. 55, No. 6, Jun. 2020, pp. 1577-1587.
Bulzacchelli et al., "Superconducting Bandpass Modulator with 2.23-GHz Center Frequency and 42.6-GHz Sampling Rate", IEEE Journal of Solid-State Circuits, vol. 37, No. 12, pp., Dec. 2002, pp. 1695-1702.

(Continued)

*Primary Examiner* — Cassandra F Cox
(74) *Attorney, Agent, or Firm* — L. Jeffrey Kelly

(57) ABSTRACT

A synchronous divider circuit with time-synchronized outputs. The synchronous divider circuit includes a plurality of divider stages including each a D-flip-flop circuit and a respective retiming flip-flop circuit, wherein an output terminal of the retiming flip-flop circuit of a current divider stage is connected to an input of the D-flip-flop circuit of a next divider stage, and wherein the current divider stage includes an additional retiming flip-flop circuit, wherein the output terminal of the retiming flip-flop circuit of the current divider stage is connected to an input terminal of the additional retiming flip-flop circuit of the current divider stage, so that an output signal of the additional retiming flip-flop circuit of the current divider stage and an output terminal of the retiming flip-flop circuit of the next divider stage are time-synchronized with respect to each other.

18 Claims, 13 Drawing Sheets

(56) References Cited

OTHER PUBLICATIONS

Gielen et al., "Time-Encoding Analog-to-Digital Converters", Bridging the analog gap to advanced digital CMOS-, Part 1: Basic Principles, IEEE Solid-State Circuits Magazine, Spring 2020, pp. 47-55.

Gu et al. "A CMOS High Speed Multi-Modulus Divider With Retiming for Jitter Suppression", IEEE Microwave and Wireless Components Letters, vol. 23, No. 10. Oct. 2013, pp. 554-556.

https://web.archive.org/web/20071019072855/https://www.electronics-tutorials.ws/counter/count_3.html, "Synchronous Counter", Electronics-Tutorials, Oct. 19, 2007, Accessed on Apr. 9, 2021, 2 pages.

Majeed et al., "Synchronous Counter Design Using Novel Level Sensitive T-FF in QCA Technology", Journal of Low Power Electronics and Applications, J. Low Power Electron. Appl. 2019, 9, 27; doi:10.3390/jlpea9030027, 13 pages.

Vijeyakumar et al., "Design of High Speed Low Power Counter Using Pipelining", Journal of Scientific & Industrial Research, vol. 73, Feb. 2014, pp. 117-123.

\* cited by examiner

SYNCHRONOUS DIVIDER BASED ON CASCADED RETIMING

BACKGROUND

The invention relates generally to a synchronous divider circuit with time-synchronized outputs. The invention relates further to an analog-digital-converter, a transceiver circuit, a multiplexer, and a phase-locked loop (PLL) pre-scaler circuit into which the synchronous divider circuit may be integratable.

As clock speed of computers and related controller systems increases, the need for fast and better electronic counters and/or divider systems and/or circuits has increased. Such electronic circuits can be used in a wide variety of application areas such as wireless or wireline high-speed communication environments, as well as wire-based high-speed communication links. Another application area may be on-chip photonic links and sensors in the context of quantum computing.

A frequency divider or counter is a flip-flop whose output is inverted and fed back to its data input. The clock signal applied to this flip-flop gets divided by two because it first latches the data input by one clock edge (e.g., rising edge) into the primary latch and then copies the primary latch data to the secondary latch by the next clock edge (e.g., falling edge). Because the output is inverted and fed back to the input, two output clock cycles are required until the same output data is obtained again. Hence, such a circuit divides the input frequency by two. These divider circuits can also be implemented in different semiconductor technologies.

There are several disclosures related to divider circuits with time-synchronized outputs. A disadvantage of known solutions may often be that good technologies exist for asynchronous counters/dividers but that there is a lack for high-speed synchronous counters/dividers. Hence, there may be a need to overcome this limitation and to provide a high-speed synchronous divider whose output signals are available simultaneously.

SUMMARY

According to an aspect of the present invention, there is provided a computer implemented method including maintaining a graphical user interface to a software development According to an aspect of the present invention, a synchronous divider circuit with time-synchronized outputs may be provided. The synchronous divider circuit may include a plurality of divider stages including each a D-flip-flop circuit and a respective retiming flip-flop circuit, wherein an output terminal of the retiming flip-flop circuit of a current divider stage is connected to an input of the D-flip-flop circuit of a next divider stage, and wherein the current divider stage includes an additional retiming flip-flop circuit, wherein the output terminal of the retiming flip-flop circuit of the current divider stage is connected to an input terminal of the additional retiming flip-flop circuit of the current divider stage, so that an output signal of the additional retiming flip-flop circuit of the current divider stage and an output terminal of the retiming flip-flop circuit of the next divider stage may be time-synchronized with respect to each other.

The proposed synchronous divider circuit with time-synchronized outputs may offer multiple advantages, technical effects, contributions and/or improvements:

According to an aspect, a counter may be provided with very high frequency (e.g., >20 GHz) real time-synchronized output values, i.e., signals at the output terminals are available at the same time and not with a delay as in traditional asynchronous counters. The advantageous concept is based on the applied principle of converting a ripple counter into a synchronous counter. Furthermore, the concept proposed can be applied into any number of counter bits or frequency division ratios. In practical implementations, the only limitation may be given by the input clock load which increases due to the additionally used retiming stages and consequently required more powerful drivers. The additional retiming flip-flop of a current stage may also compensate for the minimal delay coming from the next stage divider due to its internal delay.

Based on this concept, the synchronization of outputs of the divider stages is advantageously being achieved, and it is also become understandable or a person skilled in the art that the highest operating frequency is independent of the division ratio (e.g., 2^N). The limitation for practical implementations may be related to, e.g., intrinsic and capacitive parasitic effects relating to the already-mentioned additional load that the input clock may need to drive. However, this may be addressed by stronger clock driver circuits or larger clock buffers.

In the following, additional embodiments of the inventive concept will be described.

According to one advantageous embodiment of the synchronous divider circuit, an input clock signal may be connected to clock input terminals of all remaining flip-flops. However, it may not be connected to the divider flip-flop of the next stage because this may be connected to the output of the flip-flop of the previous stage.

According to another advantageous embodiment of the synchronous divider circuit, in case the number of the plurality of divider stages is larger than 2, respective output signals of retiming flip-flops of current divider stages may be cascaded through the synchronous divider circuit. This way, any number of divider stages may be connected in series to provide counters of any length.

According to an embodiment of the synchronous divider circuit, the synchronous divider circuit may be built by any of the following semiconductor technologies: CPL technology (complementary pass transistor logic), DPL technology (double pass transistor logic), CMOS logic technology (complementary metal-oxide-semiconductor) which may be implemented as static or dynamic devices or bipolar technology. A wide variety of different implementation technologies may be used for the concept proposed here. The knowledge technology may also be used in different application areas without real technology constraints.

According to one preferred embodiment of the synchronous divider circuit, each of the D-flip-flops may include a primary latch and a secondary latch whose output terminals being cross-connected to input terminals of the primary latch. Thus, standard technology D-flip-flops can be used without limitations.

According to an optional embodiment of the synchronous divider circuit, each of the D-flip-flops may be implemented in a single ended form; thereby, an inverter may be connected to the D-input of each of the D-flip-flops. Thus, also different forms of implementation of the D-flip-flop may be used for the concept proposed here. According to an alternative embodiment of the synchronous divider circuit, each of the D-flip-flops may be implemented in a single-ended form; thereby, an inverted output signal of the D-flip-flop may be connected to a respective input of each of the D-flip-flops.

According to an embodiment of the synchronous divider circuit, each of the D-flip-flop includes a differential clock input, a positive clock signal and a related and synchronized negative clock signal, which can underline that a variety of different D-flip-flop implementations may be used.

According to a further embodiment of the synchronous divider circuit, each of the D-flip-flops may include a single-ended clock input implemented with an inverter stage. The feeding of the clock signal may be implemented in different forms.

According to a permissive embodiment of the synchronous divider circuit, each of the retiming flip-flops includes a D-flip-flop or a latch. In the latter case, it becomes clear, that a primary-secondary architecture is not a requirement for the functioning of the concept proposed here.

According to an additionally enhanced embodiment of the synchronous divider circuit, each of the retiming flip-flops and the D-flip-flop includes a reset input and a value input. This may allow building a synchronous counter for well-defined counter values, i.e., a synchronous counter that may resume counting from a well-defined counter stage. Thus, each time the synchronous counter may receive a reset signal, its counter stages may be pre-set by a defined value in binary format to allow for any resume value.

According to a further enhanced embodiment, the synchronous divider circuit may also include a clock gating circuit adapted to be controlled by a reset signal. This may be instrumental for operating the synchronous divider circuit as synchronous counter and controlled values after a reset signal may have been received.

According to further advantageous embodiments, the synchronous divider circuit may also be integrated into a plurality of more complex circuits which functionality would be improved by the synchronous divider circuit. Thereby, the synchronous divider circuit may be implemented as a counter or divider. Examples of circuits to which the synchronous divider circuit may be integrated into may include an analog-to-digital-converter circuit, a transceiver circuit for high-speed links, a multiplexer circuit, a demultiplexer circuit, and a PLL pre-scaler circuit.

BRIEF DESCRIPTION OF THE DRAWINGS

It should be noted that embodiments of the invention are described with reference to different subject-matters. In particular, some embodiments are described with reference to method type claims, whereas other embodiments are described with reference to apparatus type claims. However, a person skilled in the art will gather from the above and the following description that, unless otherwise notified, in addition to any combination of features belonging to one type of subject—matter, also any combination between features relating to different subject—matters, in particular, between features of the method type claims, and features of the apparatus type claims, is considered as to be disclosed within this document.

The aspects defined above and further aspects of the present invention are apparent from the examples of embodiments to be described hereinafter and are explained with reference to the examples of embodiments, to which the invention is not limited.

Figure 1:
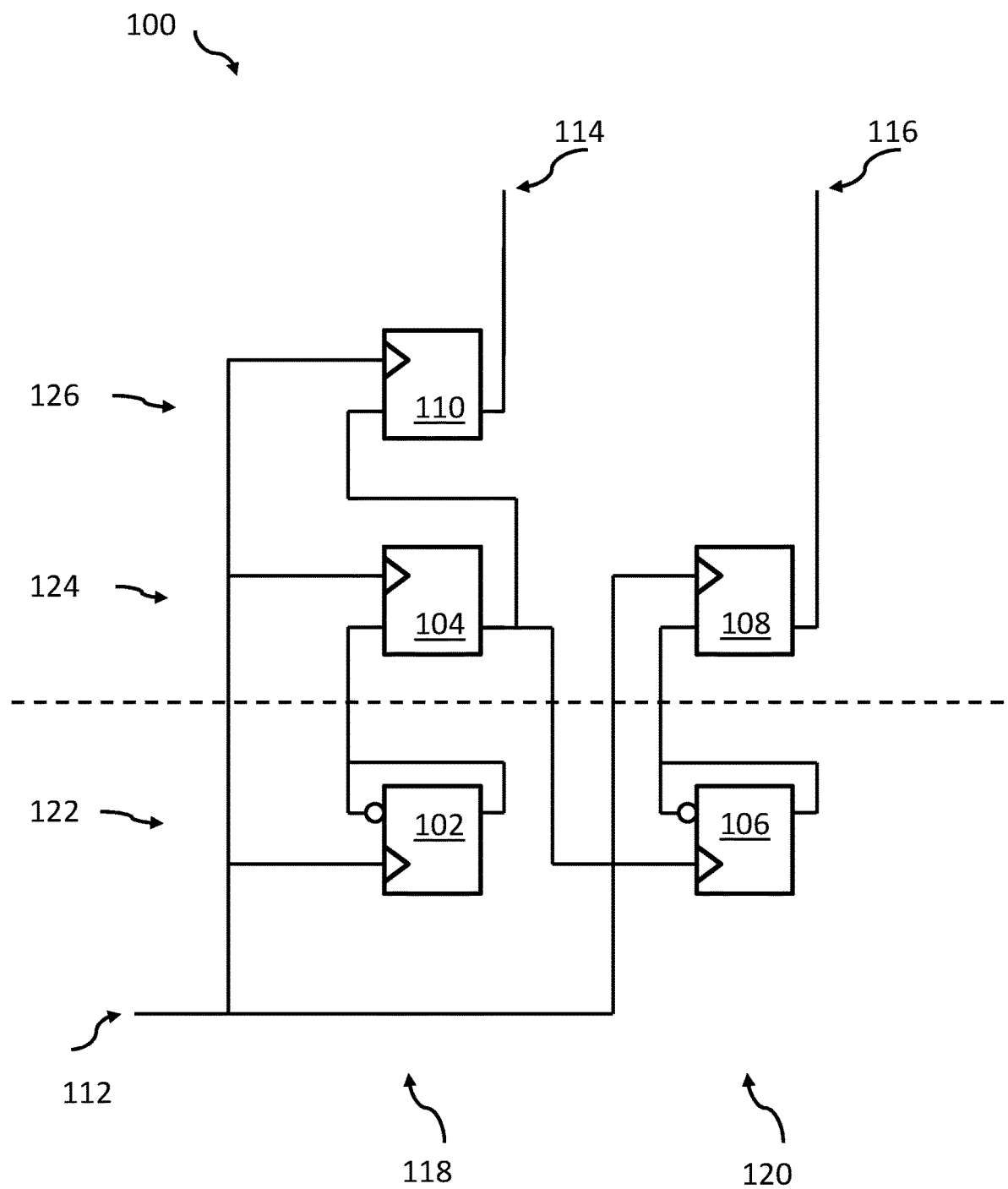
Figure 2:
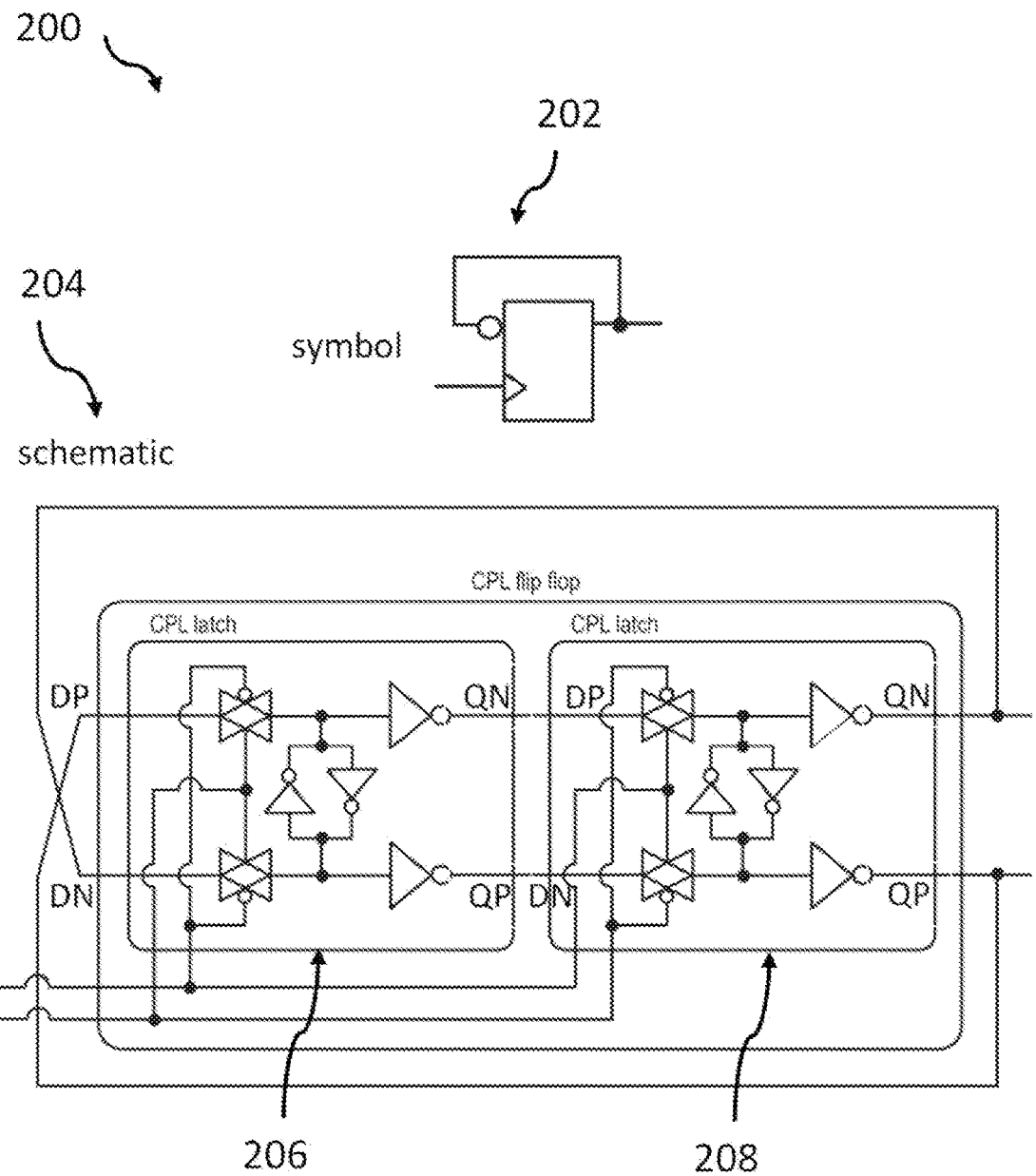
Figure 3:
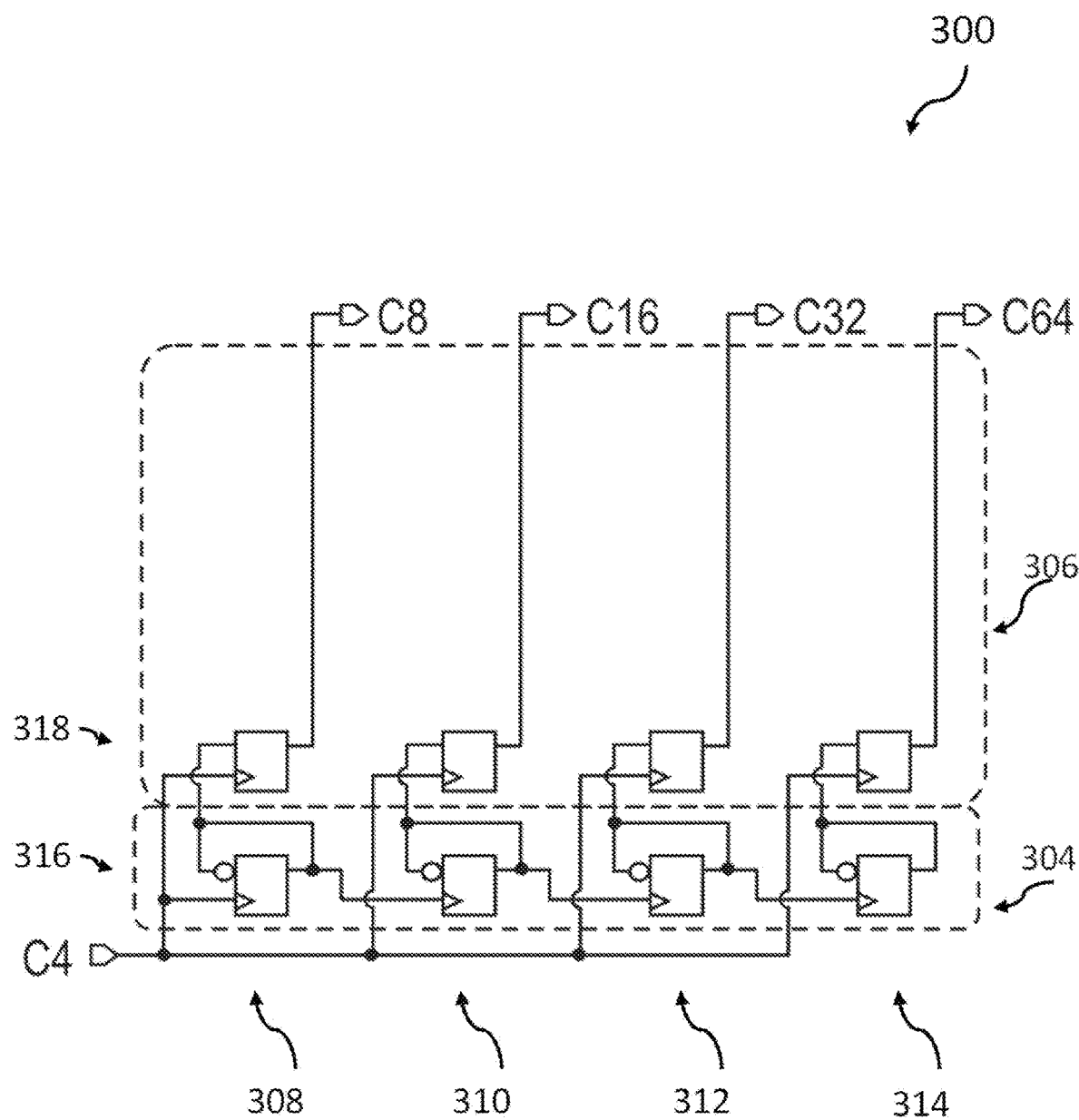
Figure 4:
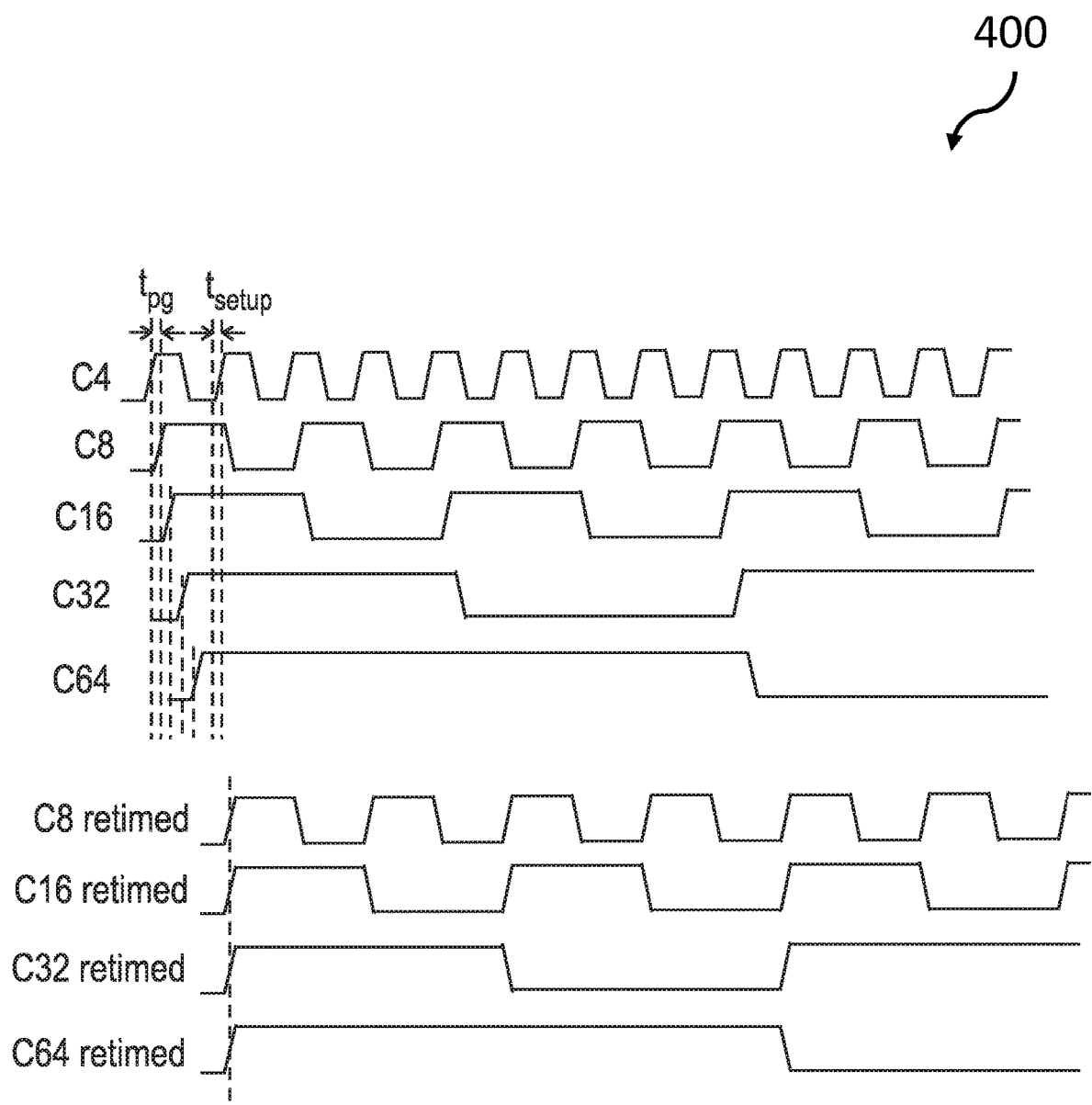
Figure 5:
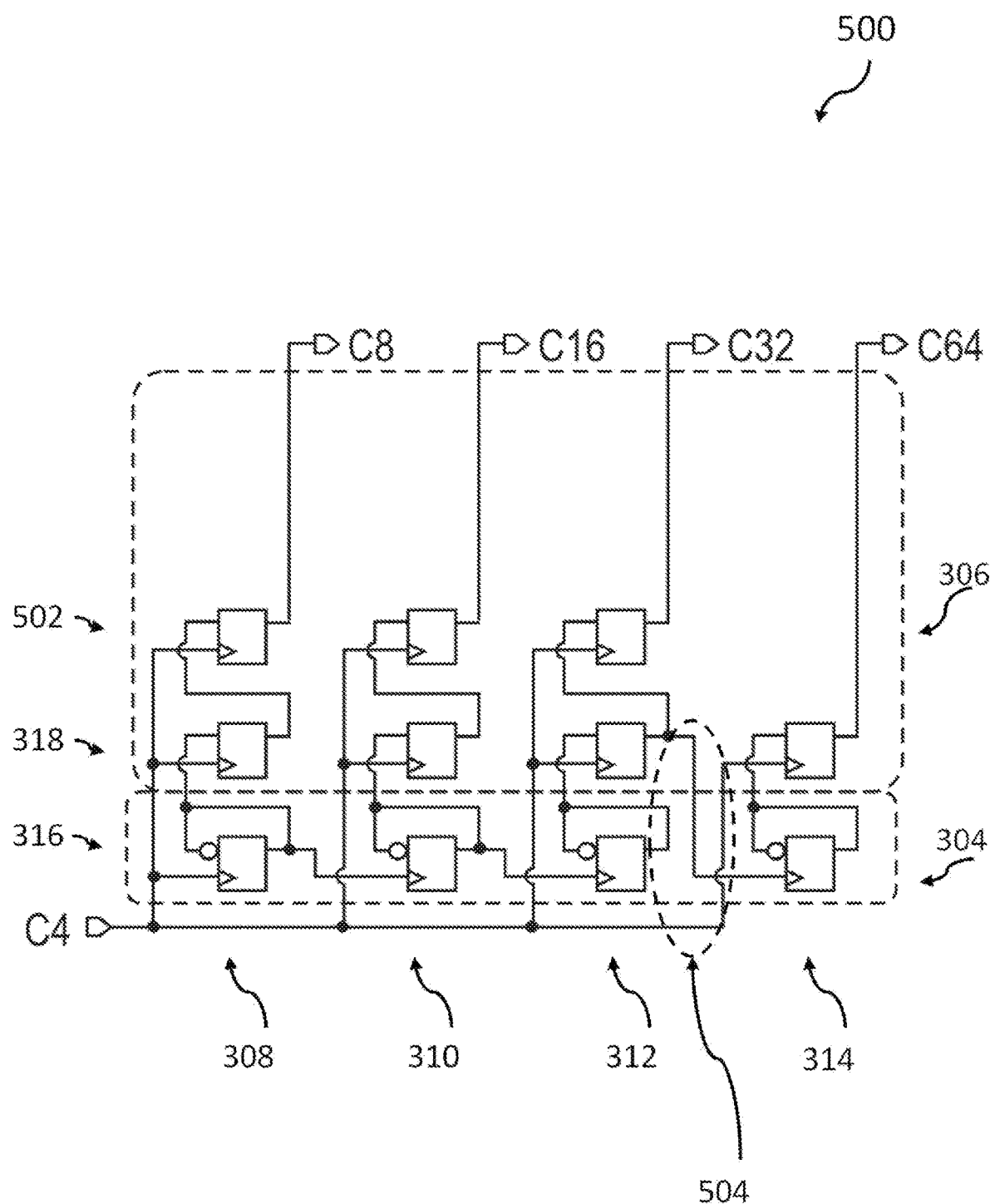
Figure 6:
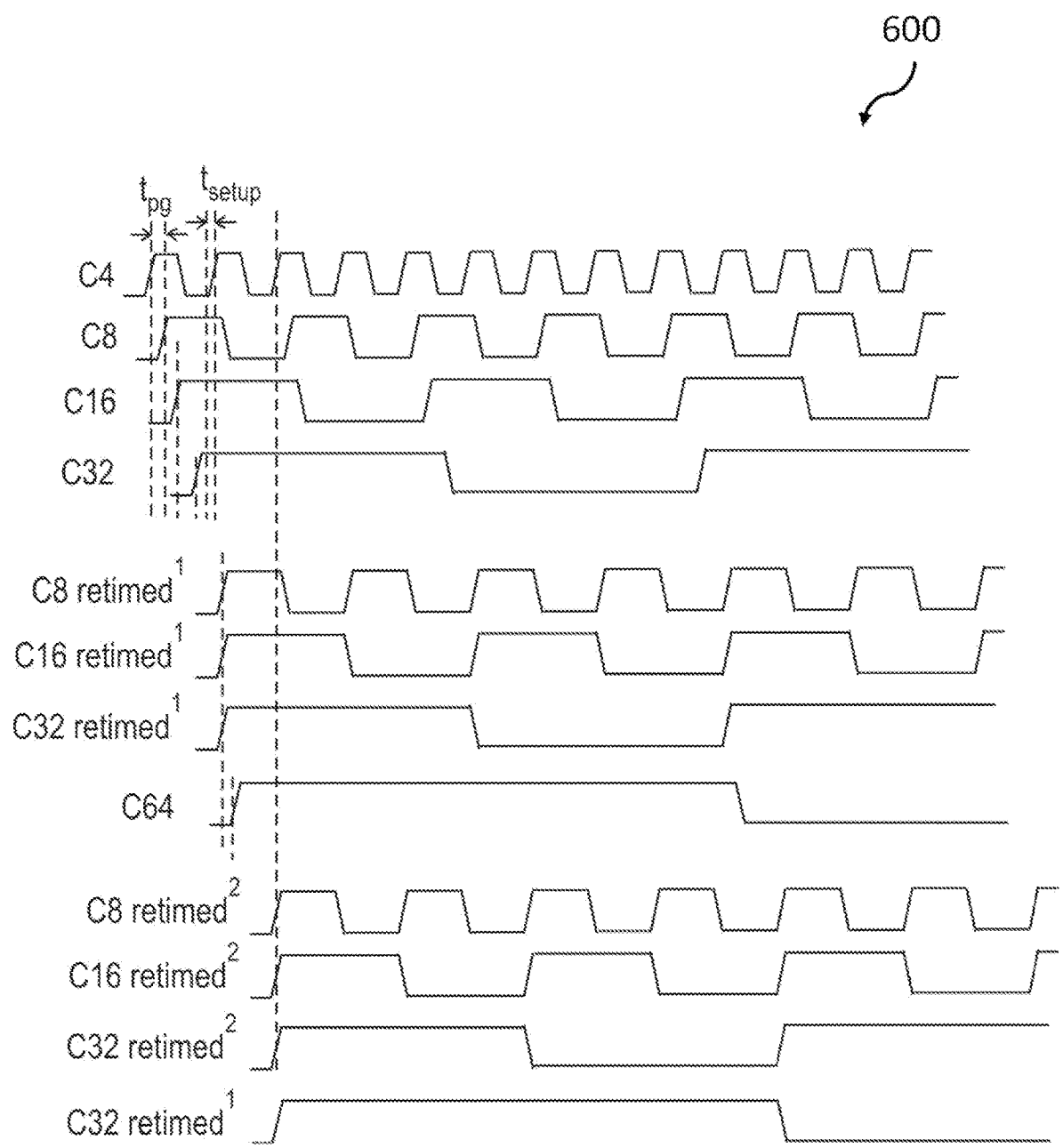
Figure 7:
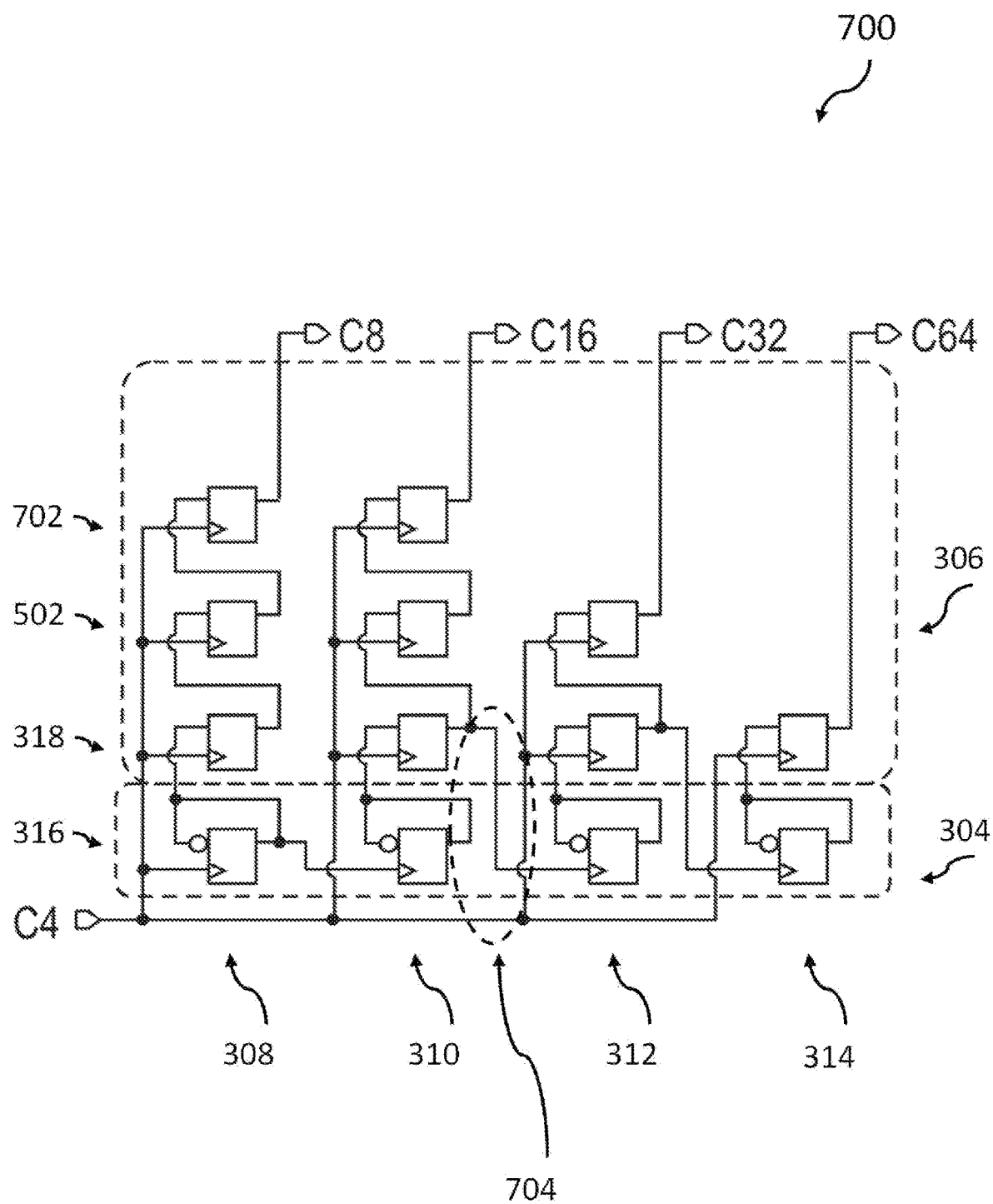
Figure 8:
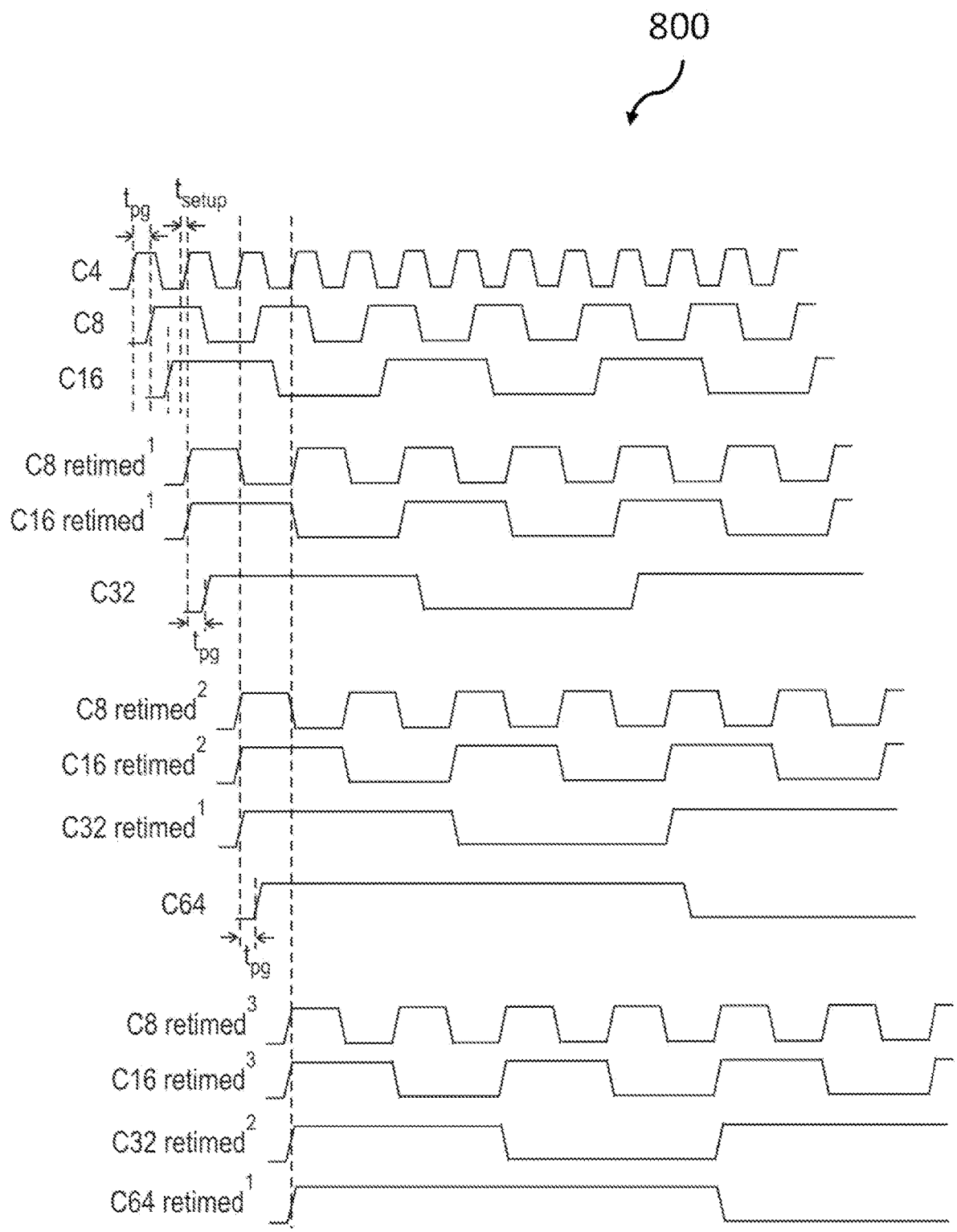
Figure 9:
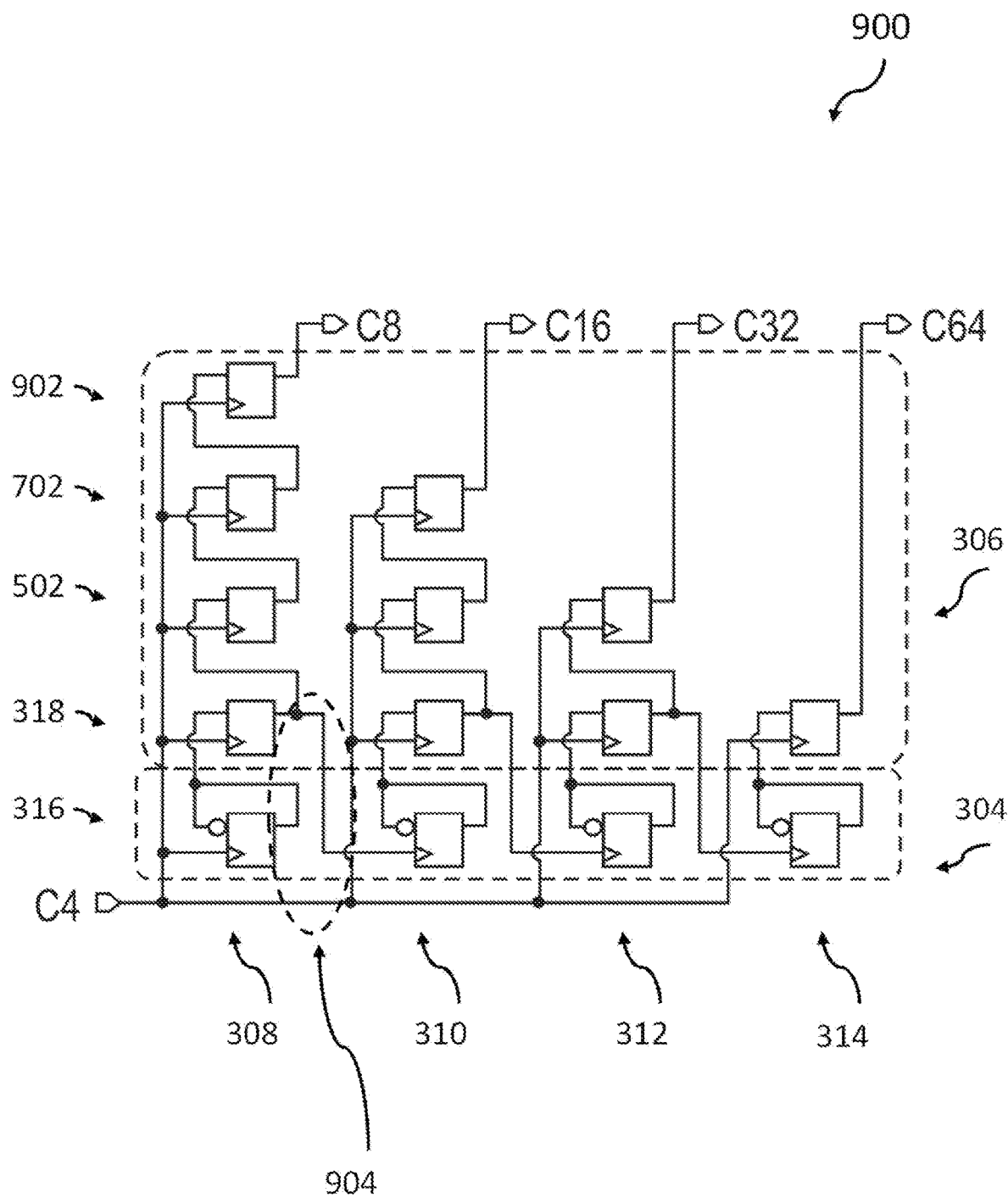
Figure 10:
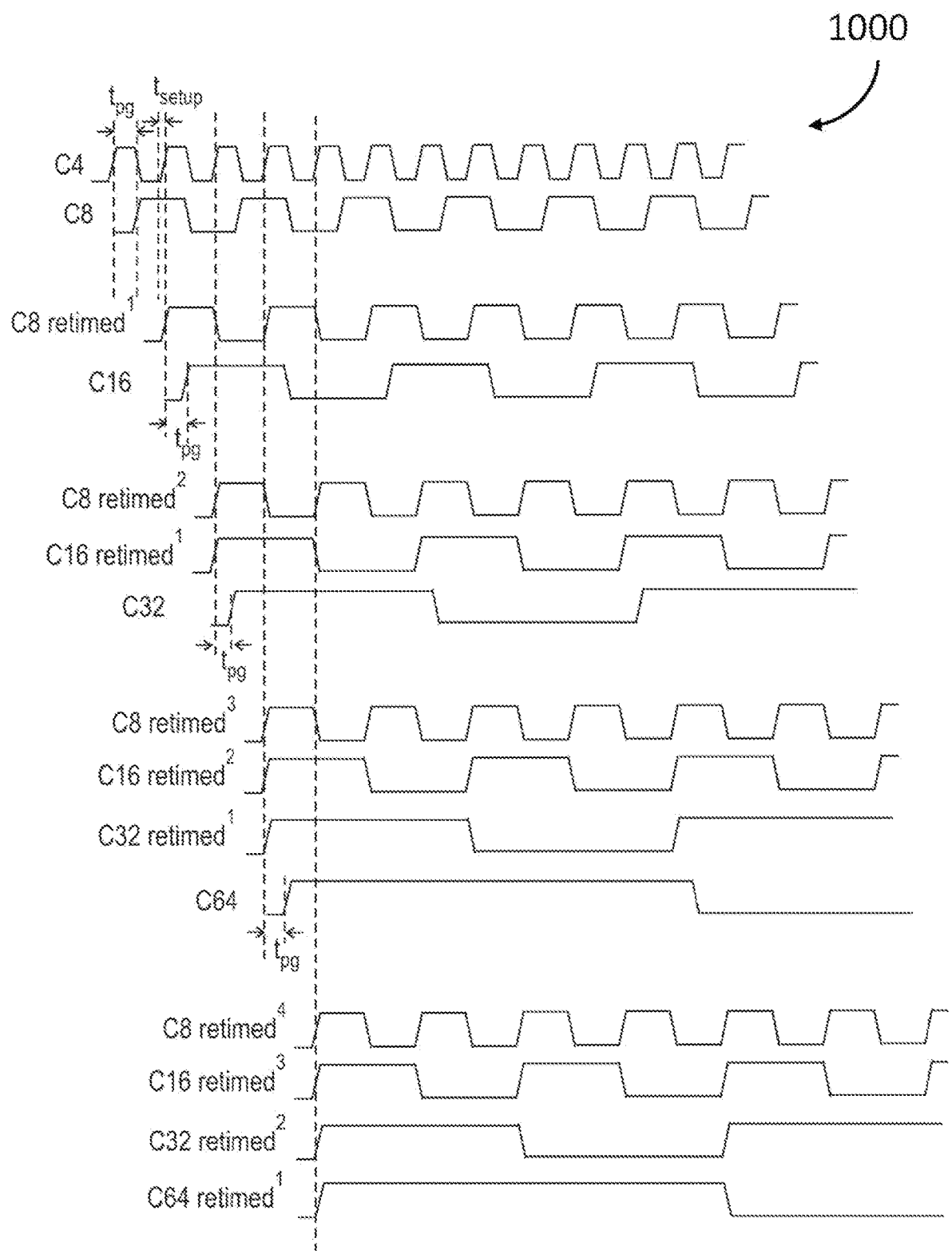
Figure 11:
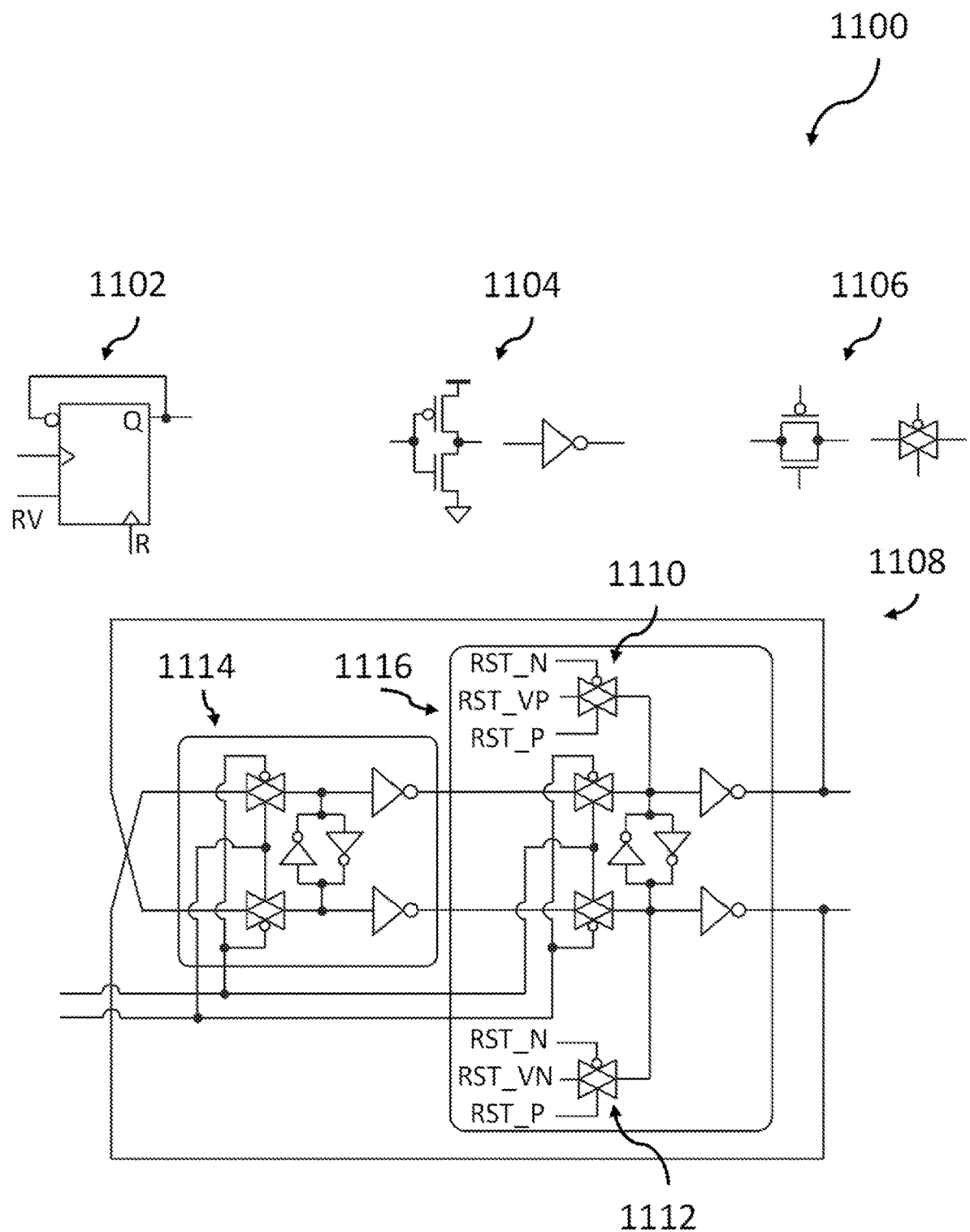
Figure 12:
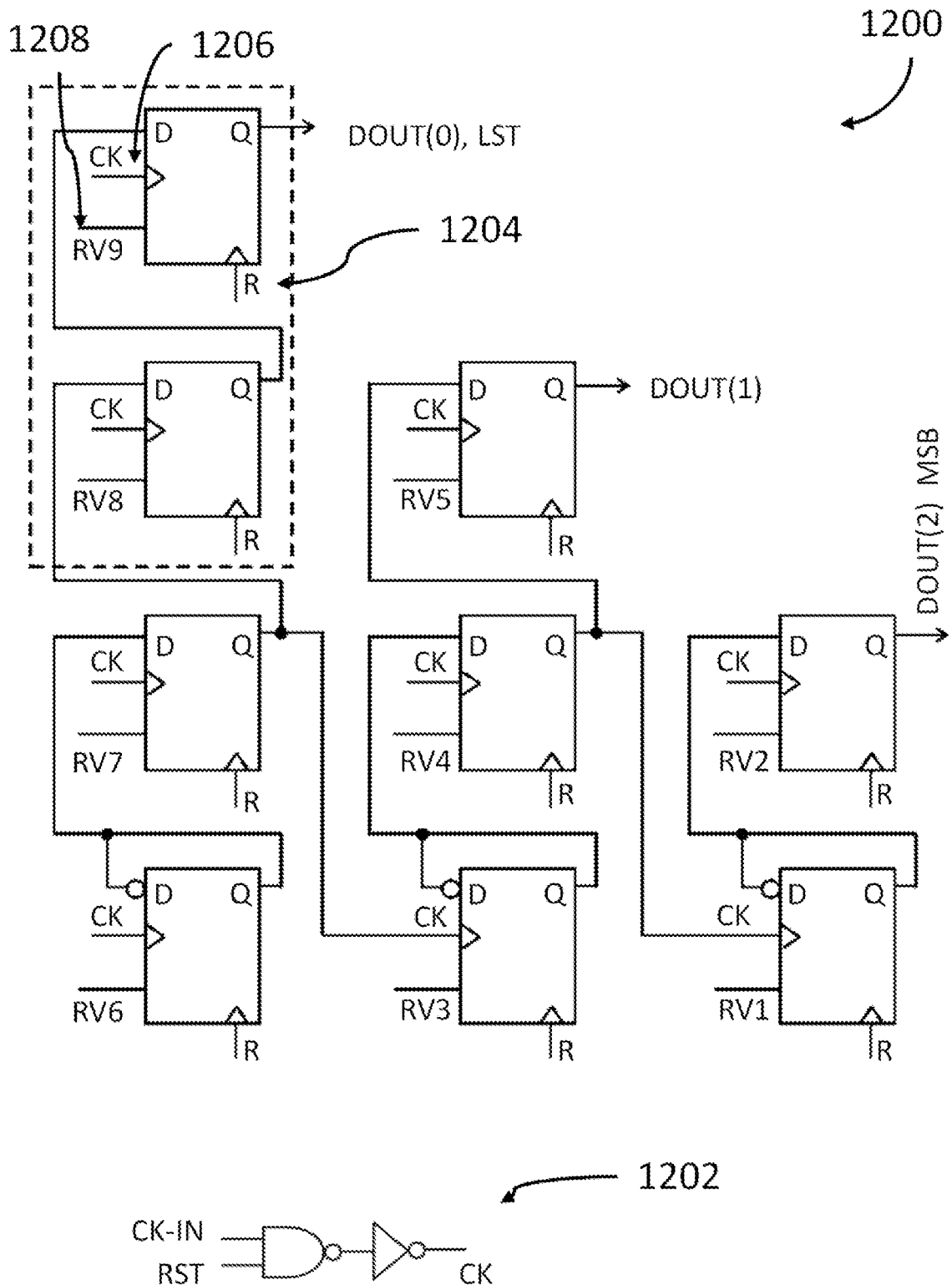
Figure 13:
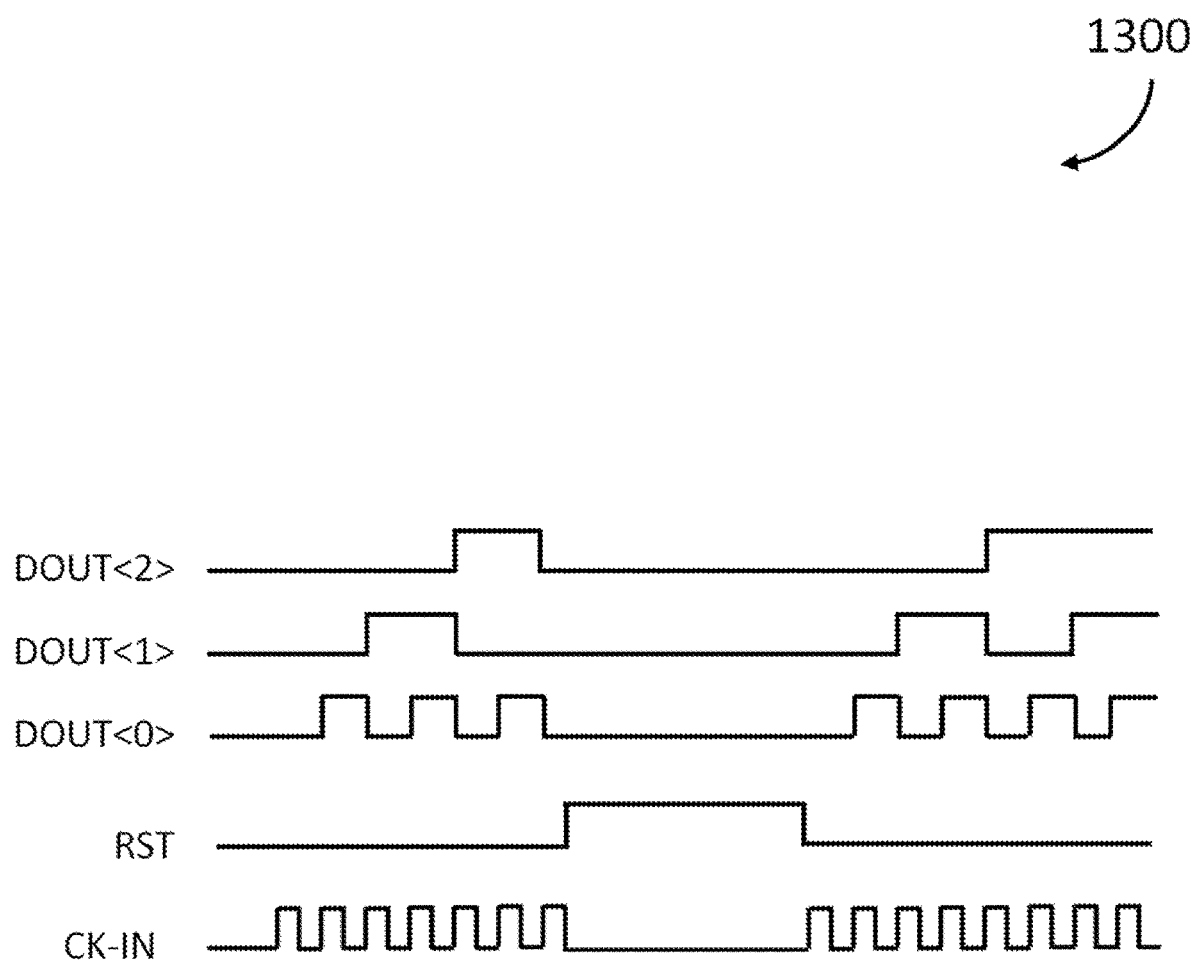

Preferred embodiments of the invention will be described, by way of example only, and with reference to the following drawings:

FIG. 1 shows a block diagram of an embodiment of the inventive synchronous divider circuit with time-synchronized outputs including two stages, according to an embodiment;

FIG. 2 shows a block diagram of an embodiment of used D-flip-flops, according to an embodiment;

FIG. 3 shows a block diagram of a traditional counter using retiming flip-flops according to an embodiment;

FIG. 4 shows a timing diagram for the traditional counter according to FIG. 3, according to an embodiment;

FIG. 5 shows an embodiment of a divider circuit in which two of the stages are connected in the newly proposed way;

FIG. 6 shows a timing diagram for the divider circuit according to FIG. 5, according to an embodiment;

FIG. 7 shows an embodiment of a divider circuit in which three of the stages are connected in the newly proposed way;

FIG. 8 shows a timing diagram for the divider circuit according to FIG. 7, according to an embodiment;

FIG. 9 shows an embodiment of a divider circuit in which all four of the stages are connected in the proposed way;

FIG. 10 shows a timing diagram for the divider circuit according to FIG. 9, according to an embodiment;

FIG. 11 shows an embodiment of an enhanced D-flip-flop with reset signals to be used in a further developed form of the synchronous counter;

FIG. 12 shows an embodiment of a 3-bit synchronous counter using the modified D-flip-flops according to FIG. 11; and FIG. 13 shows a timing diagram of selected signals for the 3-bit synchronous counter according to FIG. 13, according to an embodiment.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

Embodiments of the present invention relate generally to a synchronous divider circuit with time-synchronized outputs. The invention relates further to an analog-digital-converter, a transceiver circuit, a multiplexer, and a phase-locked loop (PLL) pre-scaler circuit into which the synchronous divider circuit may be integratable.

Therefore, the present embodiment has the capacity to improve the technical field of synchronous divider circuits and to provide a high-speed synchronous divider whose output signals are available simultaneously.

A methodology is proposed to design ultra-fast, synchronous dividers/counters. The term 'ultra-fast' refers to the fact that the critical timing path is reduced to "not violating the hold time" of a single ½-divider stage. This is an improvement over a classical divider chain where the accumulated propagation delays may not violate the dividers setup time, which leads to a much lower operation frequency.

The inventive step consists of applying cascaded retiming by the input clock so that the individual sections of the divider chain become independent from each, thereby reducing the critical timing path to just not violating the hold time of a single ½-divider stage (which is the most basic building block). Therefore, no other components than flops are required, which eases layout symmetries and the uniformity across corners (since no other components exist).

The methodology includes successively retiming from the end towards the beginning of the divider chain. This is performed by a divider where the input clock of the next divider stage is taken from a first retiming stage of the previous divider stage and the retiming stages per divider stage are cascaded to maintain the synchronization with respect to the input clock.

In the context of this description, the following conventions, terms and/or expressions may be used:

The term 'synchronous divider circuit' may denote an integrated electronic circuit including a plurality of flip-flops. At the output terminals of selected flip-flops of the plurality of the integrated electronic circuit, divided input signals may be present at the same time. Alternatively, the term 'counter circuit' may be used because the divider circuit will output a signal of a predefined number of clock cycles that have been counted. The counter may count upwards or downwards depending on the polarity conversion chosen.

The term 'time-synchronized outputs' may denote the effect that output terminals of a given electronic circuit may be available at the same point in time.

The term 'divider stage' may denote one of a plurality of units of an electronic divider circuit. At each stage, mathematically a division by two may be performed.

The term 'D-flip-flop circuit' may denote an integrated electronic divider flip-flop, i.e., an electronic circuit having two stable statuses whose transition may be triggered by an input signal. The used D-flip-flops may be implemented using a primary-secondary architecture. Hence, each D-flip-flop may include two latches (e.g., simple flip-flops).

The term 'retiming flip-flop circuit' may denote the known sequential circuit optimization technique for improving the performance of sequentially connected circuits. In general, retiming circuits may be used to optimize critical path delays in cascaded electronic circuits. It may also be used to decouple capacitive loads between successive circuits.

The term 'time-synchronized'—in particular time-synchronized signals—may denote electrical impulses—e.g., rising or falling edges—occurring at the same point in time in the sense of nearly the same time in relationship to a given operating frequency.

The term 'analog-to-digital-converter circuit' may denote an integrated electronic circuit converting an analog signal into its digital equivalent.

The term 'transceiver circuit' may denote an integrated electronic circuit including at least two components: a transmitter and a receiver for transmitting and receiving signals over—in most cases—serial communication links.

The term 'multiplexer circuit' may denote an integrated electronic circuit—also known as data selector—which may select between several analog or digital input signals and forwards the selected input to a single output line.

The term 'demultiplexer circuit' may denote an electronic integrated circuit enabling breaking down an incoming data stream into multiple lower data rate data streams. It may also be denoted as inverse multiplexer typically be used in high-speed serial communication links.

The term 'PLL (phase-locked loop) pre-scaler circuit' may denote an integrated electronic circuit in the form of a phase-locked loop architecture which may include on its input side an electronic counting circuit used to reduce its high incoming frequency electrical signal to a lower frequency by integer division. Thereby, the frequency fed to the PLL circuit and the related timer is reduced according to how the pre-scaler registers are configured such that it fits to the specification of the PLL circuit.

In the following, a detailed description of the figures will be given. All instructions in the figures are schematic. First, a block diagram of an embodiment of the inventive synchronous divider circuit with time-synchronized outputs is given.

FIG. 1 shows a block diagram of a preferred embodiment of the synchronous divider circuit with time-synchronized outputs, according to an embodiment. The synchronous divider circuit 100, which may also be implemented in form of a counter, includes a plurality of divider stages including each a D-flip-flop circuit 102, 106 and a respective retiming flip-flop circuit 104, 108. A minimum implementation would include two current divider stages 118, 120. Thereby, state-of-the-art D-flip-flops may be used as basic building blocks in a wide variety of different implementation technologies for the divider circuit as well as for the retiming flip-flop.

An output terminal of the retiming flip-flop circuit 104 of a current divider stage 118 is connected to an input of the D-flip-flop circuit 106 of the next current divider stage 120, i.e., following the current divider stage 118. The current divider stage 118 includes an additional retiming flip-flop circuit 110 and the output terminal of the related retiming flip-flop circuit 104 of the current divider stage 118 is connected to input terminal of the additional retiming flip-flop circuit 110 of the current divider stage 118.

As a consequence, an output signal 114 of the additional retiming flip-flop circuit 110 of the current divider stage 118 and an output terminal 116 of the retiming flip-flop circuit 108 of the next current divider stage 120 are time-synchronized with respect to each other, i.e., their output signals are present at the same time. Additionally, both output signals 114, 116 have a predefined delay with respect to an input clock signal 112.

It may also be noted that the different flip-flops have been assigned to different layers 122, 124, 126 of flip-flops in order for a better comprehensibility. E.g., the flip-flops making up the real frequency division belong to the layer 122, the related retiming flip-flops belong to the layer 124 and the additional retiming flip-flop 110 belongs to the layer 126. In this way, even in more complex circuits, individual flip-flops can be identified by their respective stage and layer.

Furthermore, it may be noted that the signal delay at the output terminal 116 caused by the internal signal delay of the flip-flops 106 can be compensated by the additional retiming flip-flop 110. Hence, these two flip-flops 106, 110 correspond to one another. Consequently, if more than two divider stages 118, 120 may be implemented there is always a pair of flip-flops, like the just mentioned flip-flop pair 106, 110.

FIG. 2 shows a block diagram of an embodiment of basic building blocks used for the proposed architecture, namely the D-flip-flop 200, according to an embodiment. A respective D-flip-flop symbol 202 is shown in a top area of FIG. 2. The related schematic circuitry 204 is shown in the lower part of FIG. 2. The D-flip-flop includes on its left side a primary latch 206, implemented in, e.g., CPL technology (complementary pass transistor logic latches). A differential clock signal CKP, CKN is used and fed to input terminals of the primary latch 206. The remaining wiring and used components should be known from traditional techniques. Output terminals QN and QP of the primary latch 206 are cross-connected by name as input DP and DN, respectively, to a secondary latch 208 which has basically the same components and wiring as the primary latch 206. Again, the output terminals QN, QP of the secondary-latch 208 are connected to input terminals DN, DP, respectively, of the same polarity of the primary latch 206. The D-flip-flop 200 implements a divider by two. This happens because the input data are first latched with one clock edge (e.g., the rising signal edge) into the primary latch 206 and then copies the primary latch data to the secondary latch 208 by the next clock edge (e.g., the following signal edge). Because the output is inverted and fed back to the input, two input clock cycles are required until the same output data is obtained again: thus, dividing the input frequency by two.

FIG. 3 shows a block diagram of a traditional counter 300 using retiming flip-flops of layer 318, according to an embodiment. The flip-flops of layer 316 implement a synchronous divider derived from a ripple counter (here 4 bits). The output of each DFF (D-flip-flop) of layer 316 is connected to the input of the next DFF which leads to the ripple that affects the counting. The output of each DFF of layer 316 is also connected to its own input. This inverted feedback performs a frequency division by two. The output of each of the DFFs is also connected to a respective sampling DFF of layer 318 for each weight of the counter. This is done to decouple the counter load from successive circuitries, i.e., successive divider stages.

Because the output of each DFF in the chain needs to hand over its value to the input of the next DFF, the overall counter value is valid until the counter update, triggered by a next cycle of the clock, has traversed through the whole chain of DFFs. It may be noted that the clock input signal carries the reference numeral C4 and the output lines of the terminals are denoted C8, C16, C32, C64 of each of the DFFs of layer 318, respectively. Hence, the retiming DFF of layer 318 may also be denoted as edge aligners, i.e., decoupling the output signals C8, C16, C32, C64 from the connection between DFF of subsequence divider stages 308, 310, 312, 314. The DFFs of layer 318 represent edge aligners 306. Consequently, the DFFs of layer 316 represent a divider chain 304. The rippling through the chain of DFFs has given the name to this type of counter, namely "ripple counter". Alternatively, the clock may have also been denoted as C1 and the output terminals as C2, C4, C8, C16, respectively.

A counter can be regarded as a frequency divider because the input frequency (here, the C4 clock) is divided by the weights of the counter outputs. The weight corresponds to the number of ½-dividers until the specific output is reached. For instance, a signal at output C64 corresponds to the weight $2^4=16$ of the counter 300 and hence, it changes with a rate of the signal ratio of C4/16. Similarly, for the output C32 that corresponds to the counter weight $2^3=8$ and hence, toggles with the signal ratio of C4/8. The illustration is based on a quarter-rate clock C4 but it can be any kind of clock. For instance, if C2 is used as input clock, the labeling of the output clocks would shift by 2× (i.e., C8 becomes C4, C16 becomes C8, etc.) because the division factor is defined by the ratio between the clocks (e.g., C8/C4 is a division by 2). It may be also be noted that the counter according to FIG. 3 is—because of the rippling effect—not a synchronous counter and thus, not an embodiment of the concept proposed here.

FIG. 4 shows a timing diagram 400 for the traditional counter according to FIG. 3. The relationship between the clock signal C4, and direct output signals C8, C16, C32, C64 (output of the counter DFFs) can clearly be identified as well as the output signals of the retiming DFFs C8 retimed, C16 retimed, C32 retimed, C64 retimed. The propagation delays $t_{pg}$ through the frequency-dividing flip-flops sum up through the divider chain such that, in this example, $4*t_{pg}$ stays below $T_{cycle}-t_{setup}$ wherein $T_{cycle}$ (=1/C4) is the cycle time of the input clock (here C4) and $t_{setup}$ is the setup time of the retiming latches that retime the outputs of the ripple counter on layer 316. The retiming is required to establish a synchronous operation of the outputs of the ripple counter of layer 316. The retimed outputs on layer 318 are synchronized with respect to each other and also with respect to the input clock (but with a fixed offset due to the propagation delay through the retiming latches). This kind of synchronization only works because the condition $4t_{pg}+t_{setup}<T_{cycle}$ is met and hence all ripple counter outputs on layer 316 occur, in a staggered fashion, within the same half cycle of the input clock C4. Either an increased input frequency C4 or a too long $t_{pg}$ would violate the timing and may lead to a failure of the synchronization because some ripple counter outputs may occur in the other half cycle of the input clock and will not get captured correctly by the retiming latches.

The times $t_{pg}$ are added from stage to stage, limiting the number of stages to be cascaded independently of the clock signal frequency C4. They may soon be an overlap with the setup time of the respective retiming latch or even fall into the next half-cycle of the input clock so that the retiming latches do not retime them correctly.

FIG. 5 shows an embodiment of a counter circuit 500 in which two of the stages 312, 314 are connected in the proposed way. This represents a first step towards a synchronous counter. This counter has an architectural change as a direct connection of the output of stage 312 to the input of the divider flip-flop of stage 314. In particular, the retiming flip-flop of layer 318 is connected, 504, to the divider flip-flop of the counter layer 316 of flip-flops. In addition, the output of the retiming DFF of stage 312 in layer 318 is connected to the input of another retiming DFF of the same stage 312 in layer 502.

The net of these two changes (i.e., breaking up the ripple connection from the divider chain 304 and the introduction of another retiming stage in layer 502) is that the outputs C32 and C64 are synchronous to each other (i.e., they change the state at the same time).

The reason why they are synchronized is twofold: because the rapid connection is broken up and replaced by feeding the retimed prior divider (i.e., of stage 312) to the input of the last weight of the counter (i.e., divider chain FF of layer 316), the last divider output is offset by the DFF by one propagation delay through the last divider (stage 314, layer 316). To compensate for this difference in propagation delay, the already retimed output of the last stage (312) but one counter weight is retimed another time by the DFF of stage 312/layer 502. This then makes the outputs C32 and C64 synchronous with each other since their propagation delay is the same since the DFF stage 312/layer 502 generates the same timing of the retiming DFF of the last stage (stage 314/layer 316).

It is shown in FIG. 5 that the last retiming DFFs (the top ones of stages 312 and 314) of the counter weights C32 and C64 build a kind of staircase because of the retiming of the lower weights (C8, C16) is also replicated and moved upwards (stage 308, 310, layer 502). The replication of the first layer retiming DFFs (stage 308, 310/layer 318) to the second level retiming DFFs (layer 502) is not required for C8 and C16 from a functional point of view in this phase of the derivation of a 4b synchronous counter device since their outputs C8 and C16 are still affected by the ripple counter connection between the first and the second stage 308, 310 and are not synchronous to C32 and C64.

FIG. 6 shows a timing diagram 600 for the counter circuit according to FIG. 5. Here, the situation is different to the one in FIG. 4. For illustration purposes, the C4 cycle time is shown the same as in FIG. 4, but the propagation delay is increased, which is the same from a behavioral point of view as increasing the data rate for a given propagation delay value (which is what happens in practice but is more difficult to draw in the illustration). It is shown that C64 of the divider falls into the next C4 cycle and hence, a first level retiming would fail. By breaking up the ripple connection and introducing a further second level (compare FIG. 5, 502) of retiming DFFs, the divided clocks can be realigned so that they get synchronized again after the second retiming. This is only possible because the sum of the first propagation delays is smaller than the cycle time of the input clock. Increasing the data rate once again (or extravagantly, as shown in the drawing increasing the propagation delay at the same C4 input frequency), would break the synchronization. The superscript "1" in FIG. 6 refers to the divider chain 304 of FIG. 3 while the superscript "2" refers to the divider chain 304 of FIG. 5.

FIG. 7 shows an embodiment of a counter circuit 700 in which three of the stages are connected in the way proposed here. Here, the counter input C16 is made synchronous to the already synchronized C32 and C64. Another layer of retiming DFFs in layer 702 has been introduced for the divider stages 308 and 310. The same principle as described above is used by breaking up the ripple counter connection between stage 310 and stage 312. It is replaced by the connection 704 from the retiming layer 318/stage 308 to stage 310.

FIG. 8 shows a timing diagram 800 for the counter circuit according to FIG. 7. Here, the retiming depth is increased by the additional DFFs in layer 702. Superscript "3" refers to the circuitry of FIG. 7. This retiming realigns "C64 retimed" and "C32 retimed$^2$" with "C16 retimed$^3$" and with "C8 retimed$^3$". It should be noted that without this retiming the original C64 and C32 would lay in a different C4 half cycle as C16 and hence a proper synchronization would not be possible. The respective circuits of FIG. 5 and FIG. 7 can only be synchronized completely because the propagation delay is such that C8 and C16 are in the same C4 half cycle.

FIG. 9 shows an embodiment of a synchronous divider circuit 900 with time-synchronized outputs in which all four divider stages are connected in the proposed way. If compared to FIG. 7, the steps applied above to C16, C32 and C64 are repeated, which then yields the architecture shown in FIG. 9. The final retiming stages of divider stage 308 in retiming levels 702 and 902 are added so that the staircase design becomes clear now. Here, also stages 308 and 310 are connected, 904, in a way described before.

The applied principle of converting a ripple counter to an asynchronous counter can be applied to any number of counter bits or frequency division ratios. In the practical implementation, a limitation may be given by the input clock load, which increases due to the additionally introduced retiming stages. However, a respective driver may address that potential shortcoming.

FIG. 10 shows a timing diagram 1000 for the counter circuit according to FIG. 9. The counter according to FIG. 9 can be operated at the highest input frequency because it uses the maximum retiming depth so that the C4 half cycle can be as short as the propagation delay of a single divider. In contrast to the previous retiming approach, it is implemented by a different retiming stage (layer 902), denoted by superscript "4" in the timing diagram and corresponding to the topmost DFF in FIG. 9 (retiming layer 902).

The final 4-bit synchronized divider according to FIG. 9 and timing diagram of FIG. 10 can be operated with a frequency close to $1/(t_{pg}+t_{setup})$, wherein $t_{pg}$ is the propagation delay of the DFF and $t_{setup}$ is the setup time of the DFF of the next counter weight or next divider stage.

Because of how the synchronization is built up, it becomes clear that the highest operation frequency is independent of the division ratio (e.g., 2^N) and is in practice only limited by the load that the input clocks need to drive.

FIG. 11 shows an embodiment 1100 of an enhanced D-flip-flop to be used in a further developed form of the synchronous counter. The flip-flop 1108 is also ready known from FIG. 2. It shows a primary flip-flop 1110 and a secondary flip-flop 1116. However, here a differential reset signal input RST_N and RST_P as well as a value input for a value to be set after a reset so that the D-flip-flop can resume its counting or dividing after a release of the reset signal. The reset input RST_N and RST_P as well as the differential value input RST_VN and RST_VP are fed into the passgate transistors 1110 and 1112, respectively as shown.

This requires that the reset signal occurs on the falling input clock edge where the secondary latch 1116 becomes transparent. The falling clock edge is gated (i.e., the passgate transferring the outputs of the primary latch to the inputs of the secondary latch is turned off and not conducting) and the values RST_VP and RST_VN override the secondary-latch data because the pertinent pass-gates belonging to the application of the reset signal (enabled by the control signals RST_N and RST_P) are enabled and the other pass-gates belonging to the clock of the secondary latch 1116 are disabled by the clock-gating. A similar implementation can be conceived if the reset functionality is to be applied to a primary latch 1114 and the reset signal occurs on the rising clock edge.

Furthermore, circuit equivalents of the symbols used in the D-flip-flip are shown: a symbol for the complete D-flip-flow 1102 in CPL logic with its regular output Q and configured as ½-frequency divider, its reset input R and its reset value input RV. Additionally, the used invertor is show as a circuit equivalent 1104 as well as a passgate 1106 which includes basically 2 transistors with its differential control inputs connected to the gates.

FIG. 12 shows an embodiment of a counter 1200 of a 3-bit synchronous counter using the modified D-flip-flops according to FIG. 11. The basic configuration is already known from FIG. 7 with the stages 310, 312, 314. However, here the flip-flops are shown in the form of FIG. 11. Symbolically, and applicable to all D-flip-flops in this figure the top most DFF is shown with reference numerals for the reset input R at 1204, the reset value input 1208 and the clock input D. It shall also be noticed that all DFF in this figure have extra values for the set values RV1, RV2, . . . , RV9. Hence, each of the DFFs can be set "0" or "1" as required for the counter value after a reset to the counter 1200.

This embodiment of FIG. 12 may be instrumental for applications for synchronous counters where a reset functionality is required to resume counting from a well-defined counter state. FIG. 12 shows an exemplary extension of a synchronous 3-bit counter with such reset functionality. From a high-level perspective the reset is implemented by the gating of the input clock followed by the application of the reset state to the individual D-flip flops of the synchronous counter so that the counting is resumed from that well-defined reset state once the reset signal is de-asserted. The gating circuit is shown as 1202 having as input values the clock CK_IN and the reset signal RST followed by an inverter which outputs the CK signal to all DFFs of this figure.

The exemplary resettable 3-bit counter 1200 using the resettable DFFs according to FIG. 12 shall be described next. The topology and interconnections of the counter 1200 are identical to the non-resettable synchronous 3 bit counter. The only differences are the clock-gating circuitry (here implemented with a NAND-gate) and the R and RVx inputs of the individual D-flip-flops. R stands for the reset signal and RVx stands for the value(s) that the D-flip-flop denoted by "x" shall assume in the reset state when R is asserted at 1204. The signals RV1, RV9 are each independent from each other, and are either logical 0 or logical 1, respectively, and represent the encoded reset state if the RST signal is asserted. The signals RV1, . . . , RV9 represent the logical states of the D-flip-flops from which the counter 1200 should resume counting once the reset signal RST (denoted by RST_N, RST_P in the differential D-flip-flip according to FIG. 11) is de-asserted.

The schematic of the resettable synchronized 3-bit counter 1200 includes a dashed box on the top left side. This box identifies a part of the circuit that may be redundant and may be omitted. The reason is that the box occurs in the column of the LSB (least significant bit) pipeline (i.e., the divider stage in which the LSB weight of the counter is propagating upwards in the drawing of FIG. 12). Because the LSB has a periodicity of 2, the counter 1200 states in the LSB column repeat after 2 LSB clock cycles (i.e., 4 input clock cycles). Because of that, the output DOUT<0> could already be taken without loss of information from the respective D-flip-flop output that is located just below the box in the figure. The periodicity of the LSB+1 is 4 LSB-clock cycle (i.e., 8 input clock cycles) and so on for the higher weights of the counter 1200. It shall also be noted that this statement about the redundancy that can be saved also applies to the non-resettable counter.

FIG. 13 shows a timing/timing diagram of selected signals for the 3-bit synchronous counter according to FIG. 12. The waveform diagram 1300 show that an assertion of the reset signal RST leads to the gating of the incoming clock CK_IN and the counter outputs DOUT<0>, DOUT<1> and DOUT<2> are reset to zero while the de-assertion of RST enables the clock again so that the counter resumes counting from where the RV1, . . . , RV9 reset values have set the state of the counter during the reset phase.

It should also be noted that the synchronous divider circuit proposed here with time-synchronized outputs can be used in a wide variety of different more complex circuits, namely in a serializer/deserializer (SERDES) of high-speed communication links, a transceiver (sender/receiver in, e.g., the 5G communication standard), multiplexers and demultiplexers, as well as in PLL pre-scaler circuits, just to name a few.

The descriptions of the various embodiments of the present invention have been presented for purposes of illustration, but are not intended to be exhaustive or limited to the embodiments disclosed. Many modifications and variations will be apparent to those of ordinary skills in the art without departing from the scope and spirit of the described embodiments. The terminology used herein was chosen to best explain the principles of the embodiments, the practical application or technical improvement over technologies found in the marketplace, or to enable others of ordinary skills in the art to understand the embodiments disclosed herein.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The terminology used herein is for the purpose of describing particular embodiments only and is not intended to limit the invention. As used herein, the singular forms a, an and the are intended to include the plural forms as well, unless the context clearly indicates otherwise. It will further be understood that the terms comprises and/or comprising, when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or steps plus function elements in the claims below are intended to include any structure, material, or act for performing the function in combination with other claimed elements, as specifically claimed. The description of the present invention has been presented for purposes of illustration and description, but is not intended to be exhaustive or limited to the invention in the form disclosed. Many modifications and variations will be apparent to those of ordinary skills in the art without departing from the scope and spirit of the invention. The embodiments are chosen and described in order to best explain the principles of the invention and the practical application, and to enable others of ordinary skills in the art to understand the invention for various embodiments with various modifications, as are suited to the particular use contemplated.

In a nutshell, the inventive concept may be summarized by the following.

A synchronous divider circuit with time-synchronized outputs, the synchronous divider circuit including a plurality of divider stages including each a D-flip-flop circuit and a respective retiming flip-flop circuit, where an output terminal of the retiming flip-flop circuit of a current divider stage is connected to an input of the D-flip-flop circuit of a next divider stage, and where the current divider stage includes an additional retiming flip-flop circuit, where the output terminal of the retiming flip-flop circuit of the current divider stage is connected to an input terminal of the additional retiming flip-flop circuit of the current divider stage, so that an output signal of the additional retiming flip-flop circuit of the current divider stage and an output terminal of the retiming flip-flop circuit of the next divider stage are time-synchronized with respect to each other.

An embodiment where an input clock signal is connected to clock input terminals of all remaining flip-flops. An embodiment where, in case the number of the plurality of divider stages is larger than 2, respective output signals of retiming flip-flops of current divider stages are cascaded through the synchronous divider circuit. An embodiment where the synchronous divider circuit is built on one selected out of the group including CPL technology, DPL technology, CMOS logic technology or bipolar technology. An embodiment where each of the D-flip-flops includes a primary latch and a secondary latch which output terminal are cross-wise connected to input terminal of the primary latch. An embodiment where each of the D-flip-flops are implemented in a single ended form and wherein an inverter is connected to a D-input of each of the D-flip-flops. An embodiment where each of the D-flip-flops are implemented in a single ended form and wherein an invented output signal of the D-flip-flop is connected to a respective input of each of the D-flip-flops. An embodiment where each of the D-flip-flop includes a differential clock input. An embodiment where each of the D-flip-flops includes a single-ended clock input implemented with an inverter stage. An embodiment where each of the retiming flip-flops includes a D-flip-flop or a latch. An embodiment where each of the retiming flip-flops and the D-flip-flop includes a reset input and a value input. An embodiment also including a clock gating circuit adapted to be controlled by a reset signal. An embodiment where the synchronous divider circuit is integrated into an analog-to-digital-converter circuit. An embodiment where the synchronous divider circuit is integrated into a transceiver circuit for high speed links. An embodiment where the synchronous divider circuit is integrated into a multiplexer circuit. An embodiment where the synchronous divider circuit is integrated into a de multiplexer circuit. An embodiment where the synchronous divider circuit is integrated into a PLL pre-scaler circuit.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A synchronous divider circuit with time-synchronized outputs, the synchronous divider circuit comprising:
   a plurality of divider stages, each of the plurality of divider stages comprising a D-flip-flop circuit and a respective retiming flip-flop circuit, wherein an output terminal of the retiming flip-flop circuit of a current divider stage of the plurality of divider stages is connected to an input of the D-flip-flop circuit of a next divider stage of the plurality of divider stages, and
   wherein the current divider stage of the plurality of divider stages comprises an additional retiming flip-flop circuit, wherein the output terminal of the retiming flip-flop circuit of the current divider stage of the plurality of divider stages is connected to an input terminal of the additional retiming flip-flop circuit of the current divider stage of the plurality of divider stages,
   wherein an output signal of the additional retiming flip-flop circuit of the current divider stage of the plurality of divider stages and an output terminal of the retiming flip-flop circuit of the next divider of the plurality of divider stages stage are time-synchronized with respect to each other.

2. The synchronous divider circuit according to claim 1, wherein an input clock signal is connected to clock input terminals of all flip-flops.

3. The synchronous divider circuit according to claim 1, wherein the number of the plurality of divider stages is larger than 2, wherein respective output signals of retiming flip-flops of current divider stages are cascaded through the synchronous divider circuit.

4. The synchronous divider circuit according to claim 1, wherein the synchronous divider circuit is built on one selected from a group comprising CPL (complementary pass transistor logic) technology, DPL (double pass transistor logic) technology, CMOS (complementary metal-oxide-semiconductor) logic technology and bipolar technology.

5. The synchronous divider circuit according to claim 1, wherein each of the D-flip-flops comprises a primary latch and a secondary latch which the output terminals are cross-wise connected to an input terminal of the respective primary latch.

6. The synchronous divider circuit according to claim 1, wherein each of the D-flip-flops are implemented in a single ended form and wherein an inverter is connected to a D-input of each of the D-flip-flops.

7. The synchronous divider circuit according to claim 1, wherein each of the D-flip-flops are implemented in a single ended form and wherein an invented output signal of the D-flip-flop is connected to a respective input of each of the D-flip-flops.

8. The synchronous divider circuit according to claim 1, wherein each of the D-flip-flop comprises a differential clock input.

9. The synchronous divider circuit according to claim 1, wherein each of the D-flip-flops comprises a single-ended clock input implemented with an inverter stage.

10. The synchronous divider circuit according to claim 1, wherein each of the retiming flip-flops comprises a D-flip-flop.

11. The synchronous divider circuit according to claim 1, wherein each of the retiming flip-flops comprises a latch.

12. The synchronous divider circuit according to claim 1, wherein each of the retiming flip-flops and the D-flip-flop comprises a reset input and a value input.

13. The synchronous divider circuit according to claim 1, further comprising:
   a clock gating circuit adapted to be controlled by a reset signal.

14. The synchronous divider circuit according to claim 1, wherein the synchronous divider circuit is integrated into an analog-to-digital-converter circuit.

15. The synchronous divider circuit according to claim 1, wherein the synchronous divider circuit is integrated into a transceiver circuit for high speed links.

16. The synchronous divider circuit according to claim 1, wherein the synchronous divider circuit is integrated into a multiplexer circuit.

17. The synchronous divider circuit according to claim 1, wherein the synchronous divider circuit is integrated into a de multiplexer circuit.

18. The synchronous divider circuit according to claim 1, wherein the synchronous divider circuit is integrated into a PLL (phase-locked loop) pre-scaler circuit.

* * * * *